United States Patent
Zhang et al.

(10) Patent No.: US 11,870,452 B2
(45) Date of Patent: Jan. 9, 2024

(54) IQ TO PHASE CONVERSION METHOD AND APPARATUS

(71) Applicant: NXP USA, Inc., Austin, TX (US)

(72) Inventors: Yijie Zhang, Suzhou (CN); Khurram Waheed, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/822,936

(22) Filed: Aug. 29, 2022

(65) Prior Publication Data

US 2023/0124680 A1    Apr. 20, 2023

(30) Foreign Application Priority Data

Sep. 29, 2021    (CN) .......................... 202111156315.1

(51) Int. Cl.
| | |
|---|---|
| H03M 1/48 | (2006.01) |
| H03M 1/00 | (2006.01) |
| H02M 1/00 | (2006.01) |
| G06F 1/035 | (2006.01) |
| G06F 7/548 | (2006.01) |

(52) U.S. Cl.
CPC ......... *H03M 1/001* (2013.01); *H02M 1/0067* (2021.05); *G06F 1/0353* (2013.01); *G06F 7/548* (2013.01)

(58) Field of Classification Search
CPC ... H03M 1/001; H02M 1/0067; G06F 1/0353; G06F 7/548
See application file for complete search history.

(56) References Cited

U.S. PATENT DOCUMENTS

| | | | |
|---|---|---|---|
| 6,470,367 B1 | 10/2002 | Yeh et al. | |
| 8,862,650 B2 | 10/2014 | Langhammer | |
| 2011/0004645 A1 | 1/2011 | Oota | |
| 2012/0102081 A1 | 4/2012 | Hsu et al. | |
| 2015/0065194 A1* | 3/2015 | Fong | H03D 7/1483 327/357 |

OTHER PUBLICATIONS

Gutierrez et al.: "Implementation on FPGA of a LUT-Based atan(Y/X) Operator Suitable for Synchronization Algorithms", 2007 International Conference on Field Programmable Logic and Applications, IEEE, DOI: 10.1109/FPL.2007.4380692, Aug. 27-29, 2007, Amsterdam, Netherlands.

* cited by examiner

*Primary Examiner* — Joseph J Lauture (57) ABSTRACT

A method for cartesian (IQ) to polar phase conversion includes: converting a first input value into a first absolute value, and a second input value into a second absolute value; converting the first absolute value into a first logarithmic value by calculating a scaled logarithmic value of the first absolute value, and the second absolute value into a second logarithmic value by calculating a scaled logarithmic value of the second absolute value; subtracting the first logarithmic value from the second logarithmic value, to provide a subtract value; and selecting a phase value from a plurality of phase values stored in a storage unit. Each of the plurality of phase values corresponds to a respective index value, and the phase value is selected taking the subtract value as the index value.

20 Claims, 6 Drawing Sheets

IQ TO PHASE CONVERSION METHOD AND APPARATUS

CROSS-REFERENCE TO RELATED APPLICATIONS

This application claims the priority under 35 U.S.C. § 119 of China application no. 202111156315.1, filed on 29 Sep. 2021, the contents of which are incorporated by reference herein.

BACKGROUND

The present disclosure relates to a method and an apparatus for IQ to phase conversion.

IQ to phase conversion is essential in signal translation in a variety of digital communication and multimedia systems. IQ to phase conversion involves converting one or more input values representing signals in a first domain (e.g. modulated through Quadrature Amplitude Modulation, QAM) into one or more output values representing the signal in a second domain (e.g. polar phase domain). In digital signal processing, IQ to phase conversion steps usually involve inverse tangent (arctan) calculations. For example, inverse tangent functions are used in frequency discriminators, phase detectors in coherent demodulations in signal communications, and are used in polarimetric image signal processing, etc. Available inverse tangent calculation approaches include a Coordinate Rotation Digital Computer (CORDIC) algorithm which is becoming challenging because of its iterative nature causing either computational delays or unacceptable operational clock frequencies. 1-D lookup table (LUT) can be used in outputting an arctan value of an input value, which is useful in 2-quadrant arctan calculations. However, 1-D LUT becomes inapplicable in high precision 4-quadrant arctan calculations that typically require 2-D LUTs, because implementation size scales exponentially due to quadratic growth in the number of LUT elements. Challenges exist in balancing circuit costs while meeting high speed and high accuracy performance targets.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, a method for IQ to phase conversion includes: converting a first input value into a first absolute value, and a second input value into a second absolute value; converting the first absolute value into a first logarithmic value by calculating a scaled logarithmic value of the first absolute value, and the second absolute value into a second logarithmic value by calculating a scaled logarithmic value of the second absolute value; subtracting the first logarithmic value from the second logarithmic value, to provide a subtract value; and selecting a phase value from a plurality of phase values stored in a storage unit, wherein each of the plurality of phase values corresponds to a respective index value, and the phase value is selected taking the subtract value as the index value.

According to another embodiment, an apparatus for IQ to phase conversion includes an absolute value module, a first conversion module, a second conversion module, a subtractor module, and a storage unit. The absolute value module is connected to receive a first digital signal indicative of a first input value and a second digital signal indicative of a second input value. The absolute value module provides a first absolute value signal indicative of a first absolute value which is an absolute value of the first input value, and a second absolute value signal indicative of a second absolute value which is an absolute value of the second input value. The first conversion module is connected to the absolute value module. The first conversion module provides a first logarithmic signal using the first absolute value signal. The first logarithmic signal is indicative of a first logarithmic value which is a scaled logarithmic value of the first absolute value. The second conversion module is connected to the absolute value module. The second conversion module provides a second logarithmic signal using the second absolute value signal. The second logarithmic signal is indicative of a second logarithmic value which is a scaled logarithmic value of the second absolute value. The subtractor module provides a subtract value signal using the first logarithmic signal and the second logarithmic signal. The subtractor module provides the subtract value signal by subtracting the first logarithmic value from the second logarithmic value, and the subtract value signal is indicative of a difference value from the subtracting of the subtractor module. The storage unit provides a phase signal indicative of a phase value corresponding to the first input value and the second input value in response to the subtract value signal. The storage unit stores multiple phase values each is corresponding to a respective index value. The phase signal is provided by selecting in the storage unit the phase value using a subtract value indicated by the subtract value signal as the index value.

BRIEF DESCRIPTION OF THE DRAWINGS

So that the manner in which the above recited features of the present disclosure can be understood in detail, a more detailed description of the disclosure may be had by reference to embodiments, some of which are illustrated in the appended drawings. The appended drawings illustrate only typical embodiments of the disclosure and should not limit the scope of the disclosure, as the disclosure may have other equally effective embodiments. The drawings are for facilitating an understanding of the disclosure and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
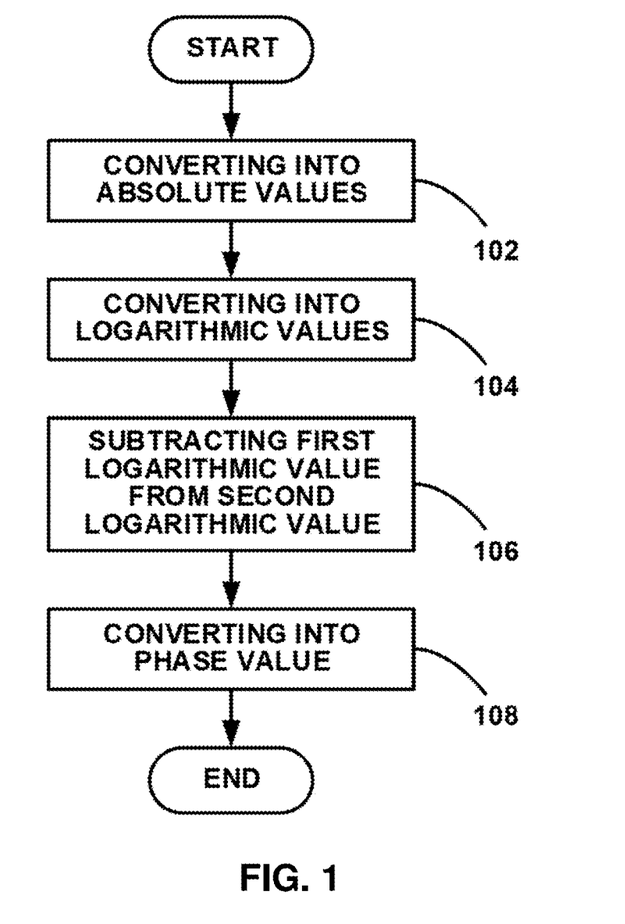
FIG. 1 is flow diagram of a method for IQ to phase conversion in accordance with an embodiment of the present disclosure.

FIG. 1 is a flow diagram of a method for IQ to phase conversion according to an embodiment of the disclosure.

The method starts with, after a first input value and a second input value are received, step 102 which converts the first input value into a first absolute value, and converts the second input value into a second absolute value. The first input value and second input value describe or are representative of a signal in a first domain, e.g. rectangular domain in which the signal is described as I+jQ, wherein I and Q are the first and second input values of the present embodiment describing the signal in the IQ or Cartesian coordinate system. With step 104 of the method, the first absolute value is converted into a first logarithmic value, which is a scaled logarithmic value of the first absolute value; and the second absolute value is converted into a second logarithmic value which is a scaled logarithmic value of the second absolute value. In particular in the present embodiment, the first absolute value is calculated to be converted into a logarithmic domain first value, and the logarithmic domain first value is scaled by a predetermined scaling factor, to be the first logarithmic value. The conversion of the step 104 is by: $X_{dbs}=20 \times \log_{10}|X|$, wherein X is the first input value, $|X|$ is the first absolute value, $\log_{10}|X|$ is the logarithmic domain value of the first absolute value $|X|$ taking 10 as the base, 20 is an example of the scaling factor in this embodiment. Similarly, for the second input value Y, the conversion of the step 104 is by: $Y_{dbs}=20 \times \log_{10}|Y|$.

Herein, logarithmic values may have any appropriate logarithmic base. Base 10 Logarithms ($\log_{10}$) will be described in the embodiments, and in such embodiments, logarithmic values may also be referred to as decibel values; however, other suitable logarithmic bases may be used, such as $\log_2$, or natural logarithms ($\log_e$, or ln).

The scaling factor of step 104 can be selected such that the resulting first logarithmic value and second logarithmic value have large enough granularities against changes in the first input value X and second input value Y. In alternative embodiments, the scaling factor can be further determined to expand ranges of the resulting first logarithmic value and second logarithmic such that the first and second logarithmic values have more convenient granularities, for example the first logarithmic value can be decided as $X_{dbs}=2^N \times 20 \times \log_{10}|X|$, wherein N can be selected in view of the data precision requirements and areas consumed. In some of the embodiments, N can be decided as 4 to 6. Furthermore, in preferably embodiments, the first logarithmic value and the second logarithmic value are the nearest integer values of the scaled logarithmic domain values, to ease subsequent digital processing. For a 10-bit unsigned first input value, the first input value ranges between 0 and 1024, and taking N=6 as an example, the range of the first logarithmic value is between 0 and 3853.

According to an embodiment, converting the first absolute value into the first logarithmic value and converting the second absolute value into the second logarithmic value are implemented as a lookup table, a dBS LUT. The dBS LUT can be in the form of a logarithmic storage unit which stores logarithmic values each corresponding to a respective index value. Taking the first absolute value as the index value, the dBS LUT provides the corresponding logarithmic value as the first logarithmic value, and the second logarithmic value is provided from the dBS LUT taking the second absolute value as the index value. Like the example above, if the first input value is a 10-bit value, the dBS LUT is a monotonic 1023-entry table. In various embodiments, there can be a respective dBS LUT for each of the first input value and the second input value, or there can be a common dBS LUT shared for the first input value and the second input value.

Step 106 of the embodiment of the method subtracts the first logarithmic value from the second logarithmic value, to provide a subtract value. Taking the above example, the resulting subtract value ranges between −3853 and +3853. According to an embodiment, a predetermined offset is added into the subtract value of subtracting the first logarithmic value from the second logarithmic value, to move the subtract value such that the subtract value is a positive integer. The predetermined offset can be 3854 for this embodiment, such that the added subtract value with the offset ranges between 1 and 7707. In alternative embodiments with different input indexes, for example with a 10-bit input index, the predetermined offset can be 4085 to make full use of the provided resolution capacities.

Step 108 of the embodiment of the method converts the subtract value into a phase value to be provided in response to the first input value and the second input value. The conversion of step 108 can also be implemented as a lookup table, an LUT. In an embodiment where the desired phase value includes an angle value in the log-polar coordinate, and the first input value and the second input value are the coordinates in the Cartesian coordinate system, the LUT can be in the form of a arctangent storage unit which stores arctangent phase values each is corresponding to a respective index value. Taking the subtract value as the index value, the arctangent LUT provides the corresponding arctangent value as the phase value. The arctangent value ARCTAN $$\left(\frac{Y}{X}\right)$$

can accordingly be used in calculation of the phase of the input coordinates X and Y, which phase describes the signal in the polar-phase coordinate system.

The embodiment of the method corresponds an arctangent value ARCTAN to a subtract value Z, derived from the difference between the first logarithmic value $X_{dbs}$ which is a logarithmic domain converted value of the first input value X and the second logarithmic value $Y_{dbs}$ which is a logarithmic domain converted value of the second input value Y, by an equation:

$$Z = \log_{10}\frac{Y}{X} = \log_{10}Y - \log_{10}X.$$

Specifically, the LUT uses Z as the index value, and a value atan($10^Z$) as the corresponding output value. By such, the arctangent value corresponding to the first input value X and the second input value Y is not directly provided from the quotient of $$\frac{Y}{X},$$

the calculation of which is difficult and resource-consuming and thus time-consuming. Instead, the embodiment converts the quotient of $$\frac{Y}{X}$$

into subtract values of logarithmic values of the input values, which subtract values are correlated to the required arctangent values in the LUT. It is understood that the logarithmic values of the input values can be implemented through the dBS LUTs, and the subtracting operation is more convenient.

Figure 2:
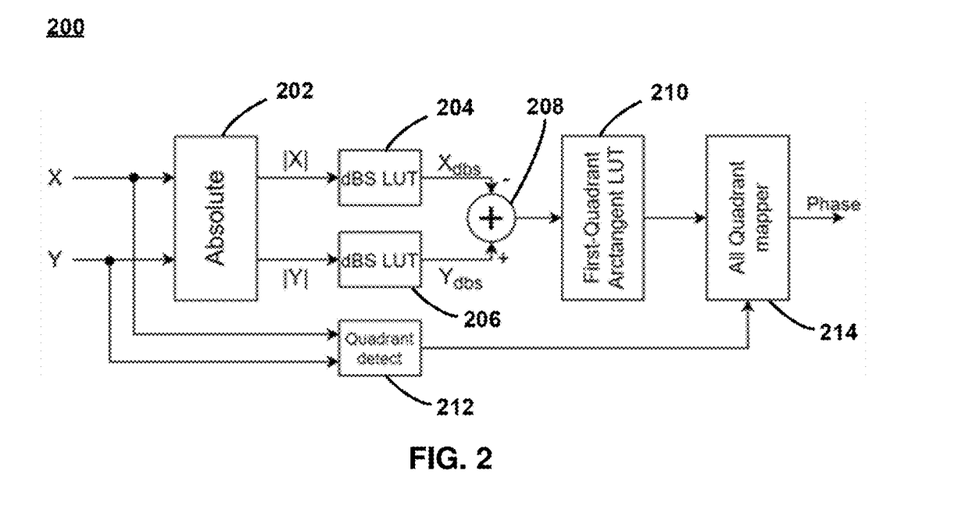
FIG. 2 is a block diagram of an apparatus for IQ to phase conversion in accordance with an embodiment.

FIG. 2 is a block diagram of an apparatus for IQ to phase conversion according to an embodiment of the present disclosure. The apparatus 200 can be implemented to perform the method of the embodiment of FIG. 1, and will be described with reference to the method of FIG. 1. The apparatus 200 includes an absolute value module 202. The absolute value module 202 is connected to receive a first digital signal indicative of a first input value X and a second digital signal indicative of a second input value Y. The absolute value module 202 provides a first absolute value signal which is indicative of a first absolute value |X| which is an absolute value of the first input value X, and provides a second absolute value signal which is indicative of a second absolute value |Y| which is an absolute value of the second input value Y.

The apparatus 200 further includes a first conversion module 204 and a second conversion module 206 that are connected to the absolute value module 202. The first conversion module 204 provides a first logarithmic signal using the first absolute value signal. The first logarithmic signal is indicative of a first logarithmic value $X_{dbs}$ which is a scaled logarithmic value of the first absolute value |X|. Similarly, the second conversion module 206 provides a second logarithmic signal using the second absolute value signal. The second logarithmic signal is indicative of a second logarithmic value $Y_{dbs}$ which is a scaled logarithmic value of the second absolute value |Y|. The conversion operations of the first conversion module 204 and the second conversion module 206 in this embodiment of the apparatus 200 are similar to the conversions of the absolute values into logarithmic domain values and the application of scaling factors as described in the embodiment of the method with reference to FIG. 1. Moreover, the first conversion module 204 and the second conversion module 206 can be implemented as the dBS LUTs as described with reference to the embodiment of the method of FIG. 1, and will not be described in detail here.

With reference to FIG. 2, the apparatus 200 according to the present embodiment includes a subtractor module 208 which is connected to the first conversion module 204 and the second conversion module 206, to respectively receive the first logarithmic signal and the second logarithmic signal. The subtractor module 208 accordingly provides a subtract value signal using the first logarithmic signal and the second logarithmic signal, by subtracting the first logarithmic value $X_{dbs}$ from the second logarithmic value $Y_{dbs}$. The provided subtract value signal is indicative of a subtract value from the subtraction by the subtractor module 208.

A storage unit 210 of the apparatus 200 receives the subtract value signal from the subtractor module 208, and provides a phase signal in response to the subtract value signal. The phase signal is indicative of a phase value corresponding to the first input value X and the second input value Y. Similar to the described with reference to step 108 of the method of FIG. 1, the storage unit 210 of the apparatus 200 of the present embodiment can be implemented as an LUT which stores phase values each is corresponding to a respective index value. With the subtract value represented by the subtract value signal as the index value to the LUT 210, the corresponding phase value is selected, and represented by the provided phase signal.

As described with reference to the embodiment of the method, the apparatus 200 includes the LUT 210 to map the desired phase value with logarithmic domain values of the input values, which avoids the calculation of the quotient of input values $$\frac{Y}{X},$$

and eases the implementation of the LUT 210, so that the LUT 210 is a 1-D LUT taking only the difference value Z as the index value, instead of requiring a 2-D LUT taking both input value X and Y as the index value. Because the LUT 210 provides the required phase value in response to the first absolute value |X| and the second absolute value |Y| both are positive values, the provided phase value is only a mapped value in the first quadrant. However, in situations where either the first input value X or the second input value Y, or both values are negative, it is desirable to convert the provided phase value into the actual quadrant as indicated by the input values X and Y.

The apparatus 200 according to the present embodiment further includes a sign detector module 212 connected to receive the first input value X and the second input value Y. The sign detector module 212 detects signs of the first input value X and the second input value Y, and accordingly uses the signs to determine a quadrant within which a point with the first input value X and the second input value Y is located. The sign detector module 212 provides the detected signs of the first input value X and the second input value Y to a calibration module 214 of the apparatus 200. The calibration module 214, also referred to as an all-quadrant mapper, is also connected to the storage unit 210, and uses the signs of the input values to adjust, or calibrate, the phase signal from the storage unit 210. In detail, if the first input value X and the second input value Y are both positive, the phase signal is provided such that the phase value is provided as a first quadrant phase value; if the first input value X is detected negative, and the second input value Y is positive, the phase signal is adjusted by the calibration module 214 indicative of a second quadrant phase value by subtracting the phase value from π. If both the first input value X and the second input value Y are both negative, the calibration module 214 adjust the phase signal by adding π to the phase value to be indicative of a third quadrant phase value; and if the first input value X is positive while the second input value Y is detected negative, the phase signal is adjusted such that the phase value is subtracted from 2π to be indicative of a fourth quadrant phase value. In additional embodiments of the method for IQ to phase conversion according to the present disclosure, there can include further steps of determining signs of the first input value and second input value, and adjusting the phase value basing on the signs of the input values, similar to the described with reference to the sign detector module 212 and the calibration module 214 of the apparatus.

The apparatus for phase conversion of FIG. 2 can further include, although not illustrated in FIG. 2, in other timing-constraint embodiments multiple timing elements, for example flip-flops connected between the first conversion module 204 and the subtractor module 208, and between the second conversion module 206 and the subtractor module 208, such that the first logarithmic value $X_{dbs}$ and the second logarithmic value $Y_{dbs}$ are provided to the subtractor module 208 at correct timings. A similar flip-flop can also be connected between the LUT 210 and the calibration module 214 for a higher timing accuracy.

Referring to the below Table 1 which shows examples of consumed areas and error degrees when implementing the phase conversion using 2D LUTs comparing to the dBS-based LUTs according to the current embodiments.

TABLE 1

Consumed areas and error degrees using different LUTs in phase conversion

| | 2D LUT | | dBS-based LUT | |
| --- | --- | --- | --- | --- |
| | | | LUT size: | LUT size: |
| | LUT size: 257*257 = 66049 Output: 10-bit error std: 0.252990 | LUT size: 129*129 = 16641 Output: 8-bit error std: 0.869101 | 1023*2 + 3854 = 5900 Output: 10-bit error std: 0.205055 | 1023*2 + 3854 = 5900 Output: 8-bit error std: 0.811958 |
| Area before place and route (μm²) | 28233 | 3795 | 2743 | 2502 |
| Max error (degree) | 0.82 | 2.38 | 0.45 | 1.50 |
| Average error (degree) | 0.21 | 0.73 | 0.18 | 0.70 |

Table 1 shows that, with an output width of 8-bit, dBS-based LUT implementations according to the embodiments above save around 34% of the area, with improved error performance in 63% of the maximum error, and 96% of the average error. With the output width expanded to 10-bit, dBS-based LUT implementations of the embodiments save up to 90% of the area, error performance improved to 55% of the maximum error, and 86% of the average error. It can be understood that, for the 2-D LUT implementations, the consumed areas grow rapidly because the consuming area is an exponential function of the output resolution. The dBS-based LUT implementations of the embodiments, on the other hand, is a 1-D LUT for which the consumed area grows linearly with the output resolution. Also seen from the precision perspective, the 1-D LUT implementations of the embodiments above are close to the theoretical resolutions (e.g. 0.3515 degree for 10-bit output) which is advantageous.

Figure 3:
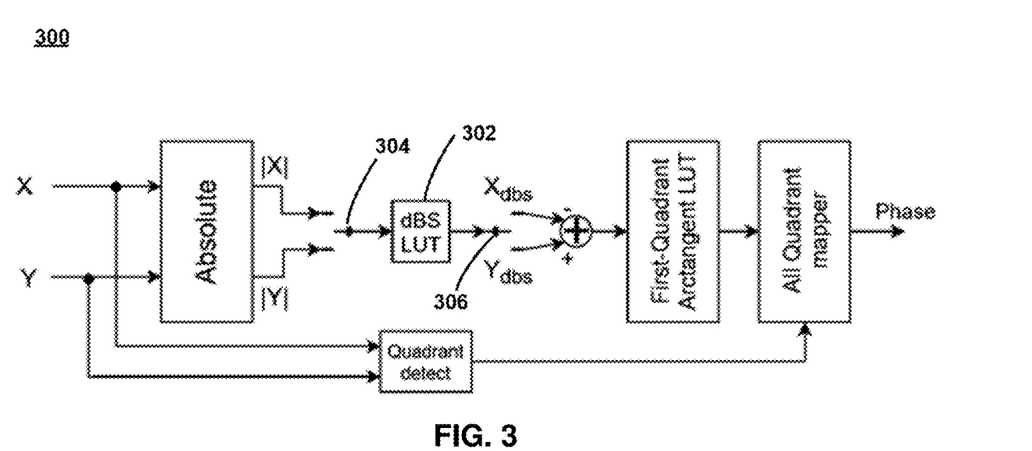
FIG. 3 is a block diagram of an apparatus for IQ to phase conversion in accordance with another embodiment.

FIG. 3 depicts a block diagram of an apparatus for IQ to phase conversion according to another embodiment. The apparatus 300 is similar to the embodiment of FIG. 2, and includes the absolute value module, the subtractor module, the storage unit, the sign detector module, and the calibration module. The first conversion module 204 and the second conversion module 206 in the apparatus 200 of FIG. 2 are implemented by a logarithmic storage unit 302 in the apparatus 300 of FIG. 3. The logarithmic storage unit 302 stores multiple logarithmic values each corresponds to a respective logarithmic index value. The apparatus 300 includes an input switch 304 which switches to couple the first absolute value signal or the second absolute value signal, both provided from the absolute value module, to the logarithmic storage unit 302. The logarithmic storage unit 302 provides the first logarithmic signal indicative of the first logarithmic value $X_{dbs}$ using the first absolute value as the logarithmic index value, and provides the second logarithmic signal indicative of the second logarithmic value $Y_{dbs}$ using the second absolute value as the logarithmic index value. The first logarithmic value or the second logarithmic value is provide to the storage unit, the arctangent LUT, through an output switch 306. The logarithmic storage unit 302 of the apparatus 300 of FIG. 3 can be an implementation of the common dBS LUT shared for the first input value and the second input value as described above.

Figure 4:
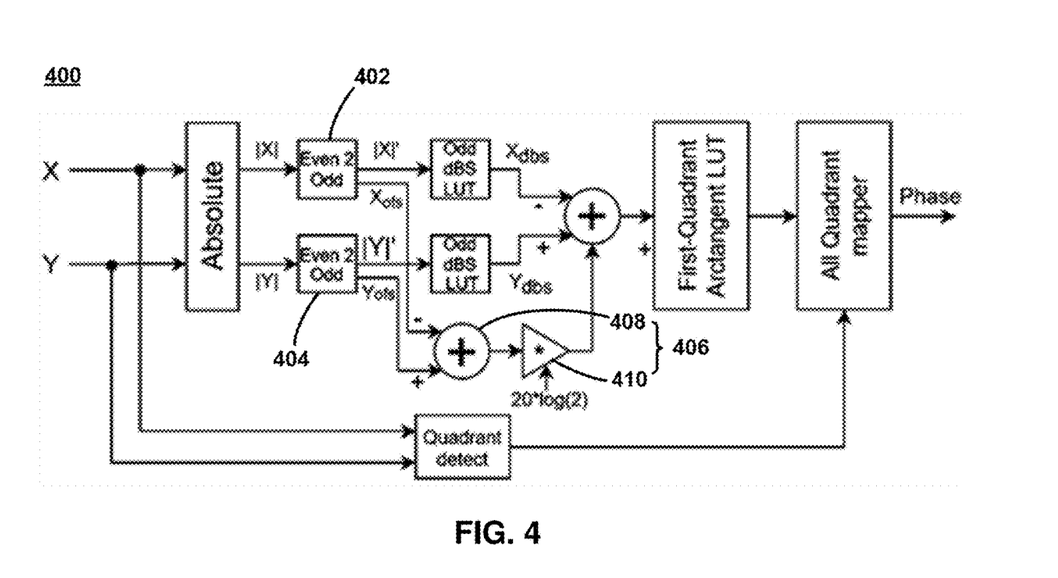
FIG. 4 is a block diagram of an apparatus for IQ to phase conversion in accordance with another embodiment.

FIG. 4 shows a block diagram of an apparatus for IQ to conversion according to another embodiment. The apparatus 400 of FIG. 4 is similar to the apparatus 200 of FIG. 2, and includes the absolute value module, the subtractor module, the storage unit, the sign detector module, and the calibration module. In addition, the apparatus 400 includes a first odd conversion module 402, a second odd conversion module 404, and a logarithmic offset module 406. The first odd conversion module 402 connects to the absolute value module to receive the first absolute value signal indicative of the first absolute value |X|, and the second odd conversion module 404 connects to the absolute value module to receive the second absolute value signal indicative of the second absolute value |Y|.

The first odd conversion module 402 converts the first absolute value |X| into a first odd value |X|' and a first exponent value $X_{ofs}$. The second odd conversion module 404 converts the second absolute value |Y| into a second odd value |Y|' and a second exponent value $Y_{ofs}$. A first odd value signal indicative of the first odd value |X|' and a second odd value signal indicative of the second odd value |Y|' are respectively provided to the first conversion module and the second conversion module to be used in being converted into the first logarithmic value $X_{dbs}$ and the second logarithmic value $Y_{dbs}$. In the embodiment, the first odd value and the second odd value are integers. The first exponent value $X_{ofs}$, taken as an integral power of two (2) and then multiplied by the first odd value |X|', results in the first absolute value |X|. Similarly, the second exponent value $Y_{ofs}$, taken as an integral power of two (2) and then multiplied by the second odd value |Y|', results in the second absolute value |Y|.

As a first step, the first odd conversion module 402 detects the first absolute value signal to determine a degree of oddness, also referred to as an "odevity", that is to say, a "degree of oddness", of the first absolute value |X|. "Degree of oddness" of an integer may be defined as the number of times (the "exponent") the integer can be divided by two and still result in an integer (the "odd value"), as will be discussed in more detail hereinbelow. Similarly, the second odd conversion module 404 detects the second absolute value signal to decide a degree of oddness of the second absolute value |Y|. Because the first input value and the second input value are provided in binary code form through the first digital signal and the second digital signal, the degree of oddness of the input values can be determined by detecting existence of leading bit "1" in the input values. If a leading bit, also known as a rightmost bit or a least significant bit, of a binary value is a bit "1", the binary value is an odd value, otherwise the binary digital value is an even value. If it is decided that the first absolute value |X| is an odd value, the first odd conversion module 402 provides the first absolute value |X| as the first odd value |X|', and the first exponent value $X_{ofs}$ is 0; if it is decided that the second absolute value |Y| is an odd value, the second odd conversion module 404 provides the second absolute value |Y| as the second odd value |Y|', and the second exponent value $Y_{ofs}$ is set as 0.

If the first absolute value |X| is decided to be an even value, which means that the leading bit of the first absolute value |X| is a bit "0", the first odd conversion module 402 converts the even first absolute value |X| into the first odd value |X|' and the first exponent value $X_{ofs}$ by: dividing the first absolute value |X| by 2 until the divided value become an odd value, and the remaining divided value is taken as the first odd value |X|'; and at each time the first absolute value |X| is divided, the first exponent value is added by 1, such that the first exponent value $X_{ofs}$ after the conversion by the first odd conversion module 402 is the number of times the first absolute value |X| is divided. A first exponent value signal from the first odd conversion module 402 and indicative of the first exponent value $X_{ofs}$ is provided to the logarithmic offset module 406.

Similarly, if the second absolute value |Y| is decided to be an even value, which means that the leading bit of the second absolute value |Y| is a bit "0", the second odd conversion module 404 converts the even second absolute value |Y| into the second odd value |Y|' and the second exponent value $Y_{ofs}$ by: dividing the second absolute value |Y| by 2 until the divided value become an odd value, and the remaining divided value is taken as the second odd value |Y|'; and at each time the second absolute value |Y| is divided, the second exponent value is added by 1, such that the second exponent value $Y_{ofs}$ after the conversion by the second odd conversion module 404 is the number of times the second absolute value |Y| is divided. A second exponent value signal from the second odd conversion module 404 and indicative of the second exponent value $Y_{ofs}$ is provided to the logarithmic offset module 406.

In alternative embodiments, the first odd conversion module 402 and the second odd conversion module 404 can be implemented by only one common conversion module which is shared by the first input value and the second input value, respectively, similar to the shared dBS LUT 302 of the apparatus 300 of FIG. 3. According to the apparatus 400 of FIG. 4, the first conversion module uses the first odd value signal to provide the first logarithmic signal indicative of the logarithmic value of the first odd value |X|', and the second conversion module uses the second odd value signal to provide the second logarithmic signal indicative of the logarithmic value of the second odd value |Y|'.

Alternatively, dividing a binary value by 2 can be understood as shifting the binary value one bit right. For example, dividing a binary value "0001010" representing number 10 which is an even value by 2 is also an implementation of right-shifting the binary value "0001010" one bit right to be "0000101" representing number 5 which is an odd value. In this regard, the first odd conversion module 402 can convert the first absolute value |X| into the first odd value |X|' and the first exponent value $X_{ofs}$ by: determining an amount of leading bits "0" in the first absolute value |X|; right-shifting the first absolute value by bits of the amount of the leading bits "0" therein, and providing the right-shifted first absolute value as the first odd value |X|'; and providing the amount of the leading bits "0" as the first exponent value $X_{ofs}$. Similarly, the second odd conversion module 404 can convert the second absolute value |Y| into the second odd value |Y|' and the second exponent value $Y_{ofs}$ by: determining an amount of leading bits "0" in the second absolute value |Y|; right-shifting the second absolute value by bits of the amount of the leading bits "0" therein, and providing the right-shifted second absolute value as the second odd value |Y|'; and providing the amount of the leading bits "0" as the second exponent value $Y_{ofs}$.

The logarithmic offset module 406 includes a subtractor unit 408 and an amplifier unit 410. The subtractor unit 408 receives the first exponent value signal from the first odd conversion module 402, and the second exponent value signal from the second odd conversion module 404. The subtractor unit 408 subtracts the first exponent value $X_{ofs}$ from the second exponent value $Y_{ofs}$ and provides a difference value of the first exponent value $X_{ofs}$ and the second exponent value $Y_{ofs}$. The amplifier unit 410 multiplies the different value of the subtracting by the subtractor unit 408 with an amplifier factor, which in this embodiment is $20 \times \log_{10} 2$, and provides a logarithmic offset value from the multiplying to the subtractor module. As shown in FIG. 4, the subtractor module subtracts the first odd logarithmic value $X_{dbs}$ of the first odd value |X|' from the second odd logarithmic value $Y_{dbs}$ of the second odd value |Y|', and then adds the logarithmic offset value, to provide the subtract value signal.

The odd conversion modules are included in the apparatus 400 of FIG. 4 to reduce the size of the arctangent LUT. Note that any even value eventually becomes an odd value if it is repeatedly divided by 2:

$$O_{odd} = \frac{I_{even}}{2^k},$$

the logarithmic domain value of an even value $I_{even}$ is accordingly: $\log I_{even} = \log(O_{odd} \times 2^k) = \log O_{odd} + \log 2^k = \log O_{odd} + k \times \log 2$. Considering the two-dimensional first input value X and second input value Y, the logarithmic domain value to be provided to the arctangent LUT is a scaled value of:

$$\log_{10} \frac{Y}{X} = \log_{10} \frac{m \times 2^j}{n \times 2^k} = \log_{10}\left(\frac{m}{n} \times 2^{(j-k)}\right) = \log_{10} m - \log_{10} n + (j-k) \times \log_{10} 2,$$

wherein m is the first odd value, n is the second odd value, $\log_{10}$ m is the first odd logarithmic value, and $\log_{10}$ n is the second odd logarithmic value. The arctangent LUT need to store only the entries for the odd index values, and the size of the arctangent LUT is halved. The amplifier factor of the subtractor unit 408, as illustrated in FIG. 4, is $20 \times \log(2)$, which is not limiting. Instead, the amplifier factor can be selected in alternative embodiments as other applicable values.

Figure 5:
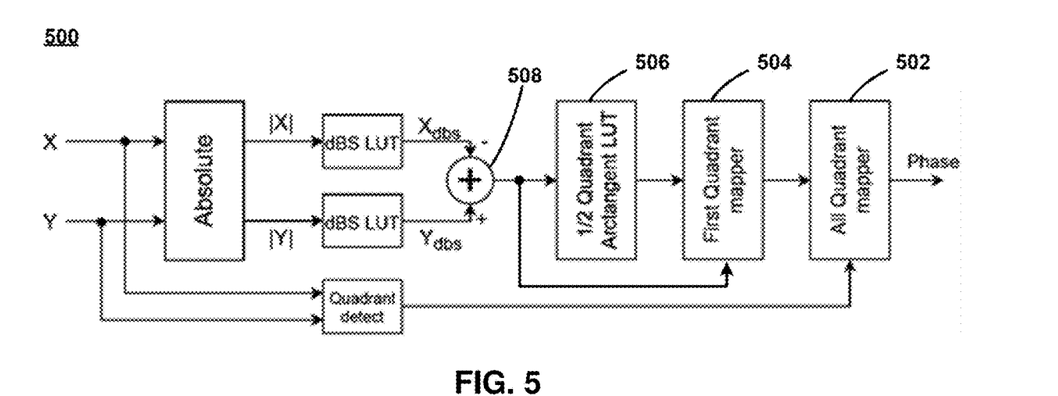
FIG. 5 is a block diagram of an apparatus for IQ to phase conversion in accordance with yet another embodiment.

FIG. 5 shows a block diagram of another embodiment of apparatus for IQ to phase conversion of the present disclosure. The apparatus 500 of FIG. 5 is similar to the apparatus 200 of FIG. 2, and includes the absolute value module, the subtractor module, the storage unit, the sign detector module, and the calibration module. In addition to the calibration module 502 which adjusts the phase value to a mapped quadrant, the apparatus 500 of FIG. 5 includes a pre-calibration module 504 connected between the storage unit and the calibration module 502. The pre-calibration module 504 is also connected to the subtractor module 508, and detects whether the first logarithmic value $X_{dbs}$ is larger than the second logarithmic value $Y_{dbs}$, or detects a sign of the difference value of the second logarithmic value $Y_{dbs}$ subtracting the first logarithmic value $X_{dbs}$. The pre-calibration module 504 modifies the phase signal from the storage unit 506, the arctangent LUT, basing on the detection. Arctangent function according to the inverse trigonometry identity have mapped symmetrical characteristic between halves of a quadrant:

$$a\tan\left(\frac{Y}{X}\right) + a\tan\left(\frac{X}{Y}\right) = \frac{\pi}{2}.$$

As described above, the arctangent LUT takes the logarithmic domain converted values of the input values as the index value:

$$Z = Y_{dbs} - X_{dbs} = \log_{10}\frac{Y}{X},$$

accordingly $$a\tan(10^Z) + a\tan(10^{-Z}) = \frac{\pi}{2},$$

wherein atan($10^Z$) is the phase value to be provided from the arctangent LUT in response to the index value Z. In the present embodiment, the storage unit 506 only stores the arctangent value entries corresponding to input values within a half quadrant. The storage unit 506 storing half-quadrant arctangent values is applicable for input values X and Y within a half of a quadrant. For example, if the second input value Y is larger than the first input value X so that the input values are within one of the halves of a quadrant, the second logarithmic value $Y_{dbs}$ is larger than the first logarithmic value $X_{dbs}$, and the arctangent LUT is able to provide a corresponding phase value in response to the positive difference value.

On the other hand, if the second input value Y is less than the first input value X so that the input values are within another half of the quadrant, the difference value of second logarithmic values $Y_{dbs}$ subtracting the first logarithmic value $X_{dbs}$ is a negative value, but can still be provided through using its positive counterpart value as the index value in the arctangent LUT and provide the required phase value as:

$$\text{phase} = \frac{\pi}{2} - a\tan(10^{-Z}).$$

As described above, the pre-calibration module 504 modifies the phase signal from the storage unit 506 using the sign of the difference value of the second logarithmic value $Y_{dbs}$ subtracting the first logarithmic value $X_{dbs}$. If the difference value from the subtractor module 508 subtracting the first logarithmic value $X_{dbs}$ from the second logarithmic values $Y_{dbs}$ is positive, the pre-calibration module 504 provides the selected value from the arctangent LUT as the phase value. If the difference value from the subtractor module 508 subtracting the first logarithmic value $X_{dbs}$ from the second logarithmic values $Y_{dbs}$ is negative, or if it is detected that the second logarithmic value $Y_{dbs}$ is less than the first logarithmic value $X_{dbs}$, the pre-calibration module 504 modifies the selected value from the arctangent LUT by subtracting the selected value from the value $$\frac{\pi}{2},$$

and provides the modified value as the required phase value.

Figure 6:
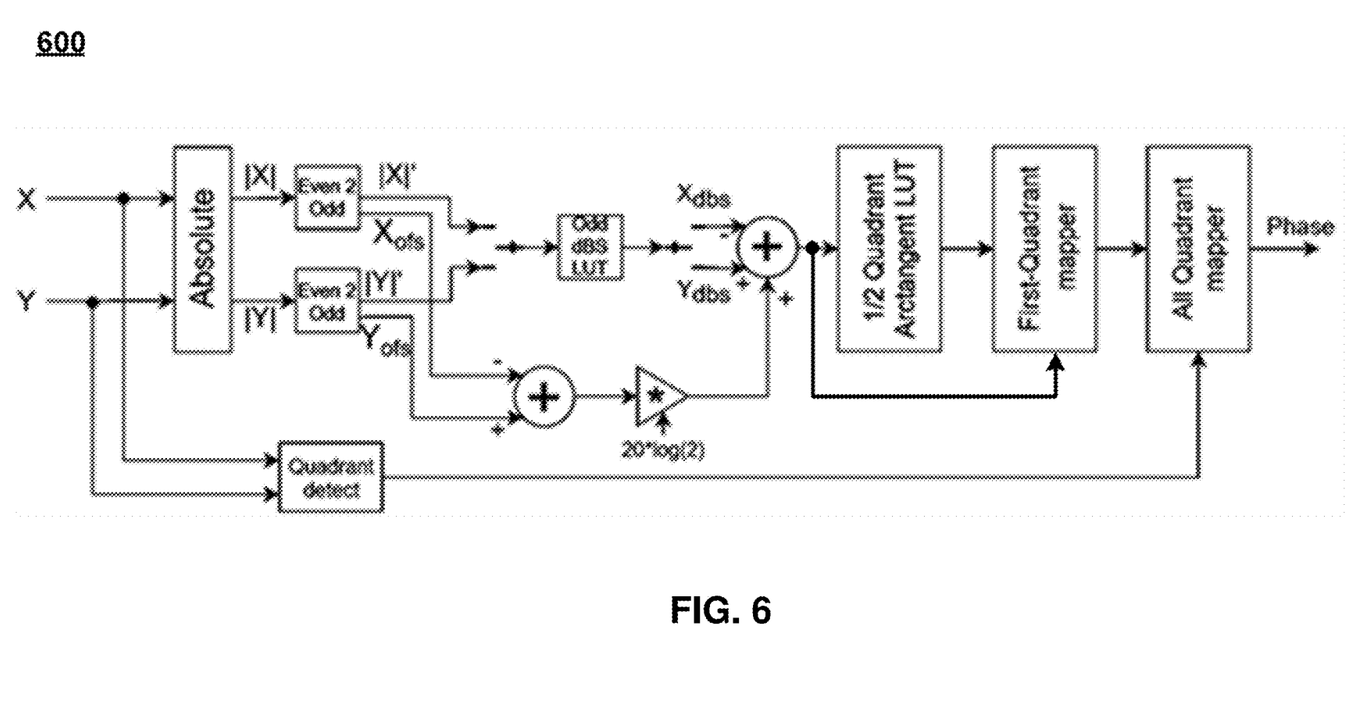
FIG. 6 is a block diagram of an apparatus for IQ to phase conversion in accordance with another embodiment.

The embodiments of FIG. 2 to FIG. 5 can be implemented in any suitable combination, and FIG. 6 shows an apparatus 600 according to an embodiment of the present disclosure which integrates the embodiments of FIG. 2 to FIG. 5. The apparatus 600 of the embodiment of FIG. 6 shares a common dBS LUT for both the first input value X and the second input value Y, and the common dBS LUT stores only phase value entries corresponding to odd input values. The apparatus 600 also includes a pre-calibration module (the first-quadrant mapper) to use the sign of the difference value of subtracting the first logarithmic value $X_{dbs}$ from the second logarithmic values $Y_{dbs}$ to adjust the half-quadrant phase value into a full quadrant phase value, and includes a calibration module (the all-quadrant mapper) to use the signs of the first input value and the second input value to adjust the phase value into the corresponding quadrant. With the pre-calibration module and the calibration module, the storage unit 506 only stores arctangent value entries for input values within half of a quadrant.

Figure 7A:
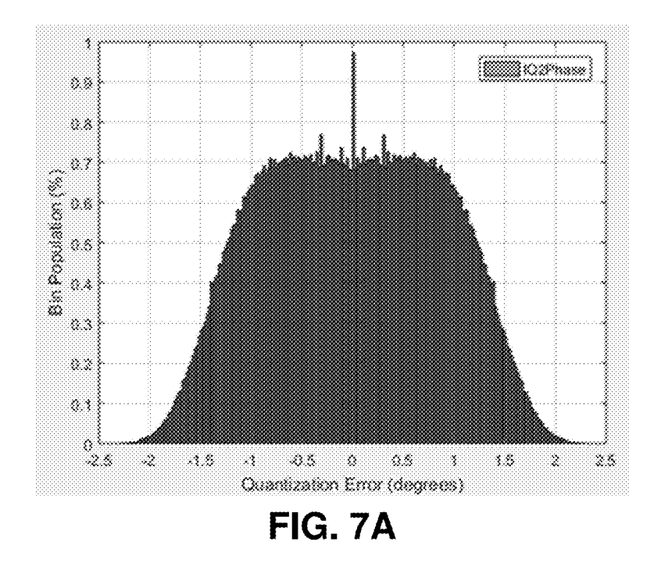
FIG. 7A, FIG. 7B, FIG. 7C, and FIG. 7D are histograms of quantization errors of phase values converted with implementations for 8 bit and 10 bit outputs.
Figure 7B:
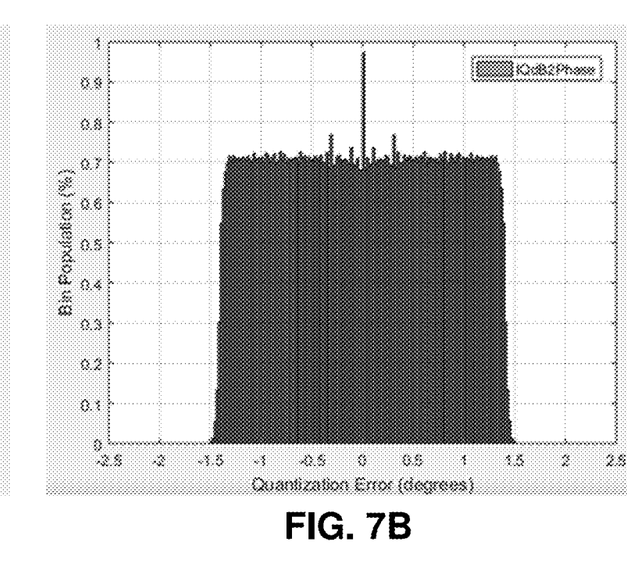
Figure 7C:
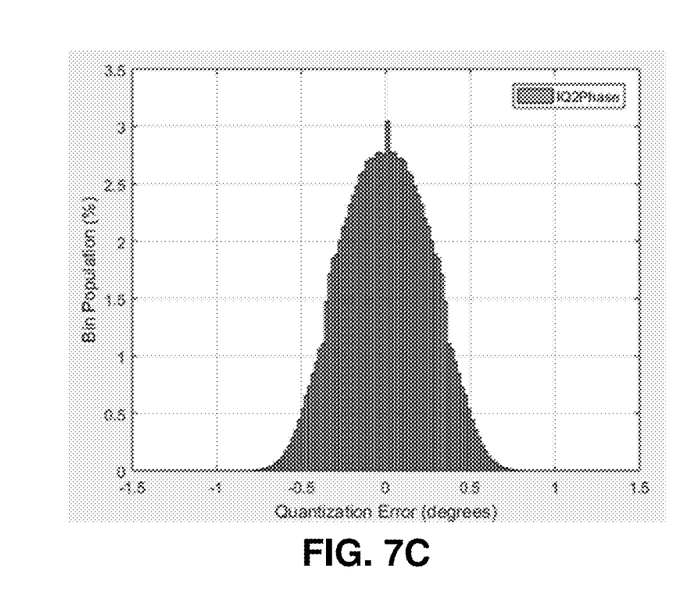
Figure 7D:
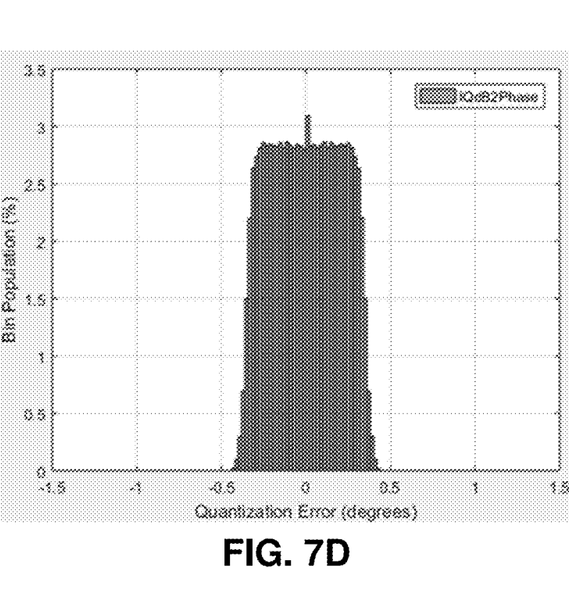

FIG. 7A is a histogram of quantization errors of the phase values converted using the 2-D LUT implementations for an 8-bit output, and FIG. 7B is a histogram of quantization errors of the phase values converted using the dBS-based 1-D LUT according to the embodiments described above for 8-bit outputs. It shows from FIG. 7A and FIG. 7B that the current dBS-based 1-D LUT narrows the majority of quantization errors of the converted phase values within a limited range between −1.5 degrees and +1.5 degrees, which is advantageous over the 2-D LUT implementations as shown in FIG. 7A. Similarly, FIG. 7C is a histogram of quantization errors of the phase values converted using the 2-D LUT implementations for a 10-bit output, and FIG. 7D is a histogram of quantization errors of the phase values converted using the embodiments of the present disclosure for 10-bit outputs. Seen from FIG. 7C and FIG. 7D, using the embodiments above, the quantization error of the converted phase values concentrate in a range narrower than −0.5 degrees to 0.5 degrees, and is improved over the results shown in FIG. 7C.

The use of the terms "a" and "an" and "the" and similar referents in the context of describing the subject matter (particularly in the context of the following claims) are to be construed to cover both the singular and the plural, unless otherwise indicated herein or clearly contradicted by context. The terms "coupled" and "connected" both mean that there is an electrical connection between the elements being coupled or connected, and neither implies that there are no intervening elements. In describing transistors and connections thereto, the terms gate, drain and source are used interchangeably with the terms "gate terminal", "drain terminal" and "source terminal".

Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the disclosure as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A method for IQ to phase conversion comprising:
   converting a first input value into a first absolute value, and a second input value into a second absolute value;
   converting the first absolute value into a first logarithmic value by calculating a scaled logarithmic value of the first absolute value, and the second absolute value into a second logarithmic value by calculating a scaled logarithmic value of the second absolute value;
   subtracting the first logarithmic value from the second logarithmic value to provide a subtract value; and
   selecting a phase value from a plurality of phase values stored in a storage unit, wherein each of the plurality of phase values corresponds to a respective index value, and the phase value is selected taking the subtract value as the index value.

2. The method of claim 1, wherein converting the first absolute value into the first logarithmic value comprises:
   converting the first absolute value into a logarithmic domain first value; and
   scaling the logarithmic domain first value by a predetermined scaling factor, to provide the first logarithmic value.

3. The method of claim 2, wherein the predetermined scaling factor is 20.

4. The method of claim 2, wherein converting the first absolute value into the first logarithmic value further comprises: providing the first logarithmic value by taking a nearest integer of the scaled logarithmic domain first value as the first logarithmic value.

5. The method of claim 1, wherein converting the second absolute value into the second logarithmic value comprises:
   converting the second absolute value into a logarithmic domain second value; and
   scaling the logarithmic domain second value by a predetermined scaling factor to provide the second logarithmic value.

6. The method of claim 5, wherein converting the second absolute value into the second logarithmic value further comprises: providing the second logarithmic value by taking a nearest integer of the scaled logarithmic domain second value as the second logarithmic value.

7. The method of claim 1, wherein
   converting the first absolute value into the first logarithmic value comprises: selecting a logarithmic value from a plurality of logarithmic values stored in a logarithmic storage unit as the first logarithmic value by taking the first absolute value as an index, wherein each of the plurality of logarithmic values corresponds to a respective index value;
   converting the second absolute value into the second logarithmic value comprises: selecting a logarithmic value from a plurality of logarithmic values stored in the logarithmic storage unit as the second logarithmic value by taking the second absolute value as an index.

8. The method of claim 1, wherein
   converting the first absolute value into the first logarithmic value comprises: selecting a logarithmic value from a plurality of logarithmic values stored in a first logarithmic storage unit as the first logarithmic value by taking the first absolute value as an index, wherein each of the plurality of logarithmic values corresponds to a respective index value;
   converting the second absolute value into the second logarithmic value comprises: selecting a logarithmic value from a plurality of logarithmic values stored in a second logarithmic storage unit as the second logarithmic value by taking the second absolute value as an index, wherein each of the logarithmic values corresponds to a respective index value.

9. The method of claim 1, wherein the providing the subtract value further comprises: adding into a subtract value of subtracting the first logarithmic value from the second logarithmic value a predetermined offset such that the added subtract value is a positive integer.

10. The method of claim 1, further comprising:
    determining a sign of the first input value and a sign of a second input value; and
    adjusting the phase value base on the signs of the first input value and the second value by:
      providing the phase value as a first quadrant phase value in response to both the first input value and the second input value being positive;
      subtracting the phase value from $\pi$ to provide a second quadrant phase value in response to the first input value being negative and the second input value being positive;
      adding $\pi$ to the phase value to provide a third quadrant phase value in response to both the first input value and the second input value being negative; and
      subtracting the phase value from $2\pi$ to provide a fourth quadrant in response to the first input value being positive and the second input value being negative.

11. The method of claim 1, further comprising:
    converting the first absolute value into a first odd value, being an integer, and a first exponent value, being an integral power of two which, when multiplied by the first odd value, results in the first absolute value;
    converting the second absolute value into a second odd value, being an integer, and a second exponent value, being an integral power of two which, when multiplied by the second odd value, results in the second absolute value;
    subtracting the first exponent value from the second exponent value to provide a difference value, and providing a logarithmic offset value dependent on the difference value;
    wherein converting the first absolute value into the first logarithmic value comprises converting the first odd value into a first odd logarithmic value, and converting the second absolute value into the second logarithmic value comprises converting the second odd value into a second odd logarithmic value; and
    wherein providing the subtract value comprises adding the logarithmic offset value into a difference value of the subtracting the first logarithmic value from the second logarithmic value.

12. The method of claim 11, wherein providing the logarithmic offset value comprises:

multiplying, by log(2), the difference value of subtracting the first exponent value from the second exponent value.

13. The method of claim 11, wherein
converting the first absolute value into the first odd value and the first exponent value comprises:
   detecting a degree of oddness of the first absolute value by determining an existence of leading bits "1" in the first absolute value;
   in response to the first absolute value an even value, dividing the first absolute value by 2, and adding the first exponent value by 1; and
   dividing the divided first absolute value by 2 and adding the first exponent value by 1 until the divided value from the first absolute value become an odd value; and wherein
converting the second absolute value into the second odd value and the second exponent value comprises:
   detecting a degree of oddness of the second absolute value by determining an existence of leading bits "1" in the second absolute value; and wherein
   in response to the second absolute value an even value, dividing the second absolute value by 2, and adding the second exponent value by 1; and
   dividing the divided first absolute value by 2 and adding the first exponent value by 1 until the divided value from the second absolute value become an odd value.

14. The method of claim 11, wherein
converting the first absolute value into the first odd value and the first exponent value comprises:
   detecting a degree of oddness of the first absolute value by determining an amount of leading bits "0" in the first absolute value;
   right shifting the first absolute value by bits of the amount of the leading bits "0" in the first absolute value;
   providing the right-shifted first absolute value as the first odd value; and
   providing the first exponent value as the amount of the leading bits "0" in the first absolute value; and wherein
converting the second absolute value into the second odd value and the second exponent value comprises:
   detecting a degree of oddness of the second absolute value by determining an amount of leading bits "0" in the second absolute value;
   right shifting the second absolute value by bits of the amount of the leading bits "0" in the first absolute value;
   providing the right-shifted second absolute value as the second odd value; and
   providing the second exponent value as the amount of the leading bits "0" in the second absolute value.

15. An apparatus for IQ to phase conversion comprising:
an absolute value module connected to receive a first digital signal indicative of a first input value and a second digital signal indicative of a second input value, and configured to provide a first absolute value signal indicative of a first absolute value which is an absolute value of the first input value, and a second absolute value signal indicative of a second absolute value which is an absolute value of the second input value;
a first conversion module connected to the absolute value module, and configured to provide a first logarithmic signal using the first absolute value signal, wherein the first logarithmic signal is indicative of a first logarithmic value which is a scaled logarithmic value of the first absolute value;
a second conversion module connected to the absolute value module, and configured to provide a second logarithmic signal using the second absolute value signal, wherein the second logarithmic signal is indicative of a second logarithmic value which is a scaled logarithmic value of the second absolute value;
a subtractor module configured to provide a subtract value signal using the first logarithmic signal and the second logarithmic signal, wherein the subtractor module provides the subtract value signal by subtracting the first logarithmic value from the second logarithmic value, and the subtract value signal is indicative of a difference value from the subtracting of the subtractor module;
a storage unit configured to, in response to the subtract value signal, provide a phase signal indicative of a phase value corresponding to the first input value and the second input value, wherein the storage unit stores multiple phase values each is corresponding to a respective index value, and wherein the phase signal is provided by selecting in the storage unit the phase value using a subtract value indicated by the subtract value signal as the index value.

16. The apparatus of claim 15, wherein
the first conversion module is configured to provide the first logarithmic signal using the first absolute value signal by:
   converting the first absolute value into a logarithmic domain first value;
   scaling the logarithmic domain first value by a predetermined scaling factor, to be the first logarithmic value; and
   providing the first logarithmic signal by taking a nearest integer of the first logarithmic value; and wherein
the second conversion module is configured to provide the second logarithmic signal using the second absolute value signal by:
   converting the second absolute value into a logarithmic domain second value;
   scaling the logarithmic domain second value by a predetermined scaling factor, to be the second logarithmic value; and
   providing the second logarithmic signal by taking a nearest integer of the second logarithmic value.

17. The apparatus of claim 15, further comprising a logarithmic storage unit configured to store multiple logarithmic values each is corresponding to a respective logarithmic index value, and wherein the first conversion module and the second conversion module are implemented by the logarithmic storage unit which provides the first logarithmic signal by selecting a logarithmic value taking the first absolute value as the logarithmic index value, and provides the second logarithmic signal by selecting a logarithmic value taking the second absolute value as the logarithmic index value.

18. The apparatus of claim 15, further comprising
a sign detector module configured to detect signs of the first input value and the second input value; and
a calibration module configured to adjust the phase signal such that the phase value is:
   provided as a first quadrant phase value in response to both the first input value and the second input value being positive;

provided as a second quadrant phase value in response to the first input value being negative and the second input value being positive, by subtracting the phase value from π;

provided as a third quadrant phase value in response to both the first input value and the second input value being negative, by adding π to the phase value; and provided as a fourth quadrant phase value in response to the first input value being positive and the second input value being negative, subtracting the phase value from 2 π.

19. The apparatus of claim 15, further comprising an odd conversion module configured to:

detect the first absolute value signal for a degree of oddness of the first absolute value by determining an existence of leading bits "1" in the first absolute value, and detect the second absolute value signal for a degree of oddness of the second absolute value by determining an existence of leading bits "1" in the second absolute value; and divide the first absolute value by 2 until the divided value therefrom become an odd first odd value, and provide a first odd value signal indicative of the first odd value and a first exponent value signal indicative of a first exponent value which is number of times the first absolute value is divided; and divide the second absolute value by 2 until the divided value therefrom become an odd second odd value, and provide a second odd value signal indicative of the second odd value and a second exponent value signal indicative of a second exponent value which is number of times the second absolute value is divided;

wherein the first conversion module is configured to use the first odd value signal to provide the first logarithmic signal indicative of a logarithmic value of the first odd value; and the second conversion module is configured to use the second odd value signal to provide the second logarithmic signal indicative of a logarithmic value of the second odd value; and wherein the subtractor module is configured to provide the subtract value signal by subtracting the logarithmic value of the first odd value from the logarithmic value of the second odd value and then adding a logarithmic offset value into a difference value of the subtracting; wherein the logarithmic offset value is a difference value of subtracting the first exponent value from the second exponent value then multiplied by log(2).

20. The apparatus of claim 15, further comprising an odd conversion module configured to:

detect the first absolute value signal for a degree of oddness of the first absolute value by determining an amount of leading bits "0" in the first absolute value; and detect the second absolute value signal for a degree of oddness of the second absolute value by determining an amount of leading bits "0" in the second absolute value; and right-shift the first absolute value by bits of the amount of the leading bits "0" therein, and provide a first odd value signal indicative of the right-shifted first absolute value and a first exponent value signal indicative of a first exponent value which is the amount of the leading bits "0" in the first absolute value; and right-shift the second absolute value by bits of the amount of the leading bits "0" therein, and provide a second odd value signal indicative of the right-shifted second absolute value and a second exponent value signal indicative of a second exponent value which is the amount of the leading bits "0" in the second absolute value;

wherein the first conversion module is configured to use the first odd value signal to provide the first logarithmic signal indicative of a logarithmic value of the right-shifted first absolute value; and the second conversion module is configured to use the second odd value signal to provide the second logarithmic signal indicative of a logarithmic value of the right-shifted second absolute value; and wherein the subtractor module is configured to provide the subtract value signal by subtracting the logarithmic value of the right-shifted first absolute value from the logarithmic value of the right-shifted second absolute value and then adding a logarithmic offset value into a difference value of the subtracting; wherein the logarithmic offset value is a difference value of subtracting the first exponent value from the second exponent value then multiplied by log(2).

* * * * *